United States Patent
Jeong et al.

(10) Patent No.: US 7,610,165 B2
(45) Date of Patent: Oct. 27, 2009

(54) SEMICONDUCTOR MEMORY DEVICE HAVING ON DIE THERMAL SENSOR

(75) Inventors: Chun-Seok Jeong, Kyoungki-do (KR); Kee-Teok Park, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 117 days.

(21) Appl. No.: 11/819,790

(22) Filed: Jun. 29, 2007

(65) Prior Publication Data
US 2008/0106321 A1    May 8, 2008

(30) Foreign Application Priority Data
Nov. 2, 2006    (KR) ................. 10-2006-0107889

(51) Int. Cl.
*G01K 7/00*    (2006.01)
(52) U.S. Cl. ............. 702/130; 702/99; 327/513; 327/538
(58) Field of Classification Search ........... 702/130, 702/104, 99; 327/513, 512, 538; 365/189.09; 377/25
See application file for complete search history.

(56) References Cited
U.S. PATENT DOCUMENTS

| | | | | |
|---|---|---|---|---|
| 5,835,553 | A * | 11/1998 | Suzuki | ............. 377/25 |
| 6,531,911 | B1 | 3/2003 | Hsu et al. | |
| 6,876,250 | B2 | 4/2005 | Hsu et al. | |
| 7,107,178 | B2 * | 9/2006 | Won et al. | ............. 702/130 |
| 7,138,823 | B2 | 11/2006 | Janzen et al. | |
| 2006/0111865 | A1 | 5/2006 | Choi | |
| 2006/0158214 | A1 | 7/2006 | Janzen et al. | |
| 2007/0040574 | A1 | 2/2007 | Janzen et al. | |

FOREIGN PATENT DOCUMENTS

| | | |
|---|---|---|
| JP | 10-255467 | 9/1998 |
| KR | 10-2002-0091657 A | 12/2002 |
| KR | 10-2005-0033123 A | 4/2005 |
| KR | 10-2005-0067520 A | 7/2005 |
| KR | 1020050082579 A | 8/2005 |
| KR | 10-0553831 B1 | 2/2006 |
| KR | 10-2006-0084572 A | 7/2006 |

OTHER PUBLICATIONS

Korean Office Action, with English Translation, issued in corresponding Korean Patent Application No. 10-2006-0107889, mailed on Nov. 20, 2007.

Korean Notice of Allowance issued in Korean Patent Application No. KR 10-2006-0107889, dated on Feb. 1, 2008.

* cited by examiner

*Primary Examiner*—Drew A Dunn
*Assistant Examiner*—Hien X Vo
(74) *Attorney, Agent, or Firm*—IP & T Law Firm PLC

(57) ABSTRACT

A semiconductor memory device includes: a temperature information output unit for measuring an internal temperature of the semiconductor memory device, and generating a plurality of flag signals, each voltage level of which varies according to the measured internal temperature; a self-refresh oscillation unit for providing a self-refresh period corresponding to the measured internal temperature in response to the plurality of flag signals; and a temperature information control unit for determining a measuring period of the temperature information output unit in response to a temperature sensing enable signal and the plurality of flag signals.

16 Claims, 4 Drawing Sheets

FIG. 4

| | TEMPERATURE | LOW | | | HIGH |
|---|---|---|---|---|---|
| TRIP_POINT_FLAG | TEMPA | L | H | H | H |
| | TEMPB | L | L | H | H |
| | TEMPC | L | L | L | H |

SEMICONDUCTOR MEMORY DEVICE HAVING ON DIE THERMAL SENSOR

CROSS-REFERENCE TO RELATED APPLICATIONS

The present invention claims priority of Korean patent application number 10-2006-0107889, filed on Nov. 2, 2006, which is incorporated by reference in its entirety.

BACKGROUND OF THE INVENTION

The present invention relates to a semiconductor memory device including an on die thermal sensor (ODTS), and more particularly, to an ODTS capable of coping with any specification discussed in an ODTS test group (TG) of a Joint Electron Device Engineering Council (JEDEC) for defining an operating point of the ODTS.

A dynamic random access memory (DRAM) cell includes a transistor for operating as a switch and a capacitor for storing a charge, i.e., data. According to whether the capacitor stores the charge, i.e., whether a terminal voltage of the capacitor is high or low, a logic level of the data is determined as a high level or a low level.

Since the data is stored in the capacitor as an accumulated electrical charge form, ideally, there is no power consumption for the data storage. However, because of a leak current due to a PN junction of a metal oxide semiconductor (MOS) transistor, the stored initial charge may be discharged and, thus, the data may vanish.

To prevent data loss, the data stored in a memory cell is read and the read data is restored into the memory cell by recharging the memory cell with a normal charge before the data vanishes. This operation should be periodically performed in order to maintain data.

The above-mentioned recharging operation is called a refresh operation and, generally, a control of the refresh operation is performed by a DRAM controller. Due to the refresh operation, refresh power is consumed. In case of a battery operated system, which requires lower power consumption, reducing power consumption is very important and is a critical issue.

One method of reducing the power consumption for the refresh operation is changing a refresh period according to temperature. As the temperature decreases, a data holding time of the DRAM is longer. Therefore, by dividing a temperature range into several temperature regions and by lowering a frequency of a refresh clock at a relatively low temperature region, power consumption is reduced.

Accordingly, a device for correctly sensing the temperature of the inside of the DRAM and for adjusting the refresh clock frequency is required.

As a semiconductor unit is highly integrated and is operated at a higher speed, a significant amount of heat is generated. The generated heat increases internal temperature of the semiconductor unit and, thus, can disturb the semiconductor unit from normal operation. The generated heat may cause a defect in the semiconductor unit.

Therefore, a device for correctly sensing the temperature of the semiconductor unit and for outputting the sensed temperature information is needed.

FIG. 1 is a block diagram of a conventional on die thermal sensor (ODTS) for use in a semiconductor memory device.

The conventional ODTS 1 includes a temperature voltage generating unit 2, an analog-to-digital converting unit 3, a code converting unit 4, and an operating controller 5.

The temperature voltage generating unit 2 detects an internal temperature of the semiconductor memory device and generates a temperature voltage VTEMP according to the detected internal temperature. Further, the temperature voltage generating unit 2 outputs maximum and minimum variation voltages VULIMIT and VLLIMIT. The maximum and minimum variation voltages VULIMIT and VLLIMIT are generated from a bandgap circuit provided in the temperature voltage generating unit 2 and keep a constant voltage level in spite of a variation of process, voltage and temperature (PVT). A user can set voltage levels of the maximum and minimum variation voltages VULIMIT and VLLIMIT in response to a virtual fuse code VIRTUAL_FUSE_CODE and an adjusting code TRIM_CODE.

The analog-to-digital converting unit 3 converts the temperature voltage VTEMP into a digital code DIGITAL_CODE having a digital value, and outputs a first update signal UPDATE1 for informing an update of the digital code DIGITAL_CODE when the digital code DIGITAL_CODE is updated according to the internal temperature of the semiconductor memory device. Herein, a voltage level of the digital code DIGITAL_CODE is adjusted between the maximum variation voltage VULIMIT and the minimum variation voltage VLLIMIT. The digital code DIGITAL_CODE is input to the temperature voltage generating unit 2 as the adjusting code TRIM_CODE to thereby adjust the digital code DIGITAL_CODE between the maximum variation voltage VULIMIT and the minimum variation voltage VLLIMIT.

The code converting unit 4 converts the digital code DIGITAL_CODE into a temperature information code TEMP_CODE and a plurality of flag signals TRIP_POINT_FLAG<0:M>, M being a positive integer, to output them with a second update signal UPDATE2 for informing an update of the temperature information code TEMP_CODE when the temperature information code TEMP_CODE is updated according to the internal temperature of the semiconductor memory device.

The operating controller 5 controls an operation on a normal mode of the ODTS 1 based on an enable signal ENABLE, controls an operation on a self-refresh mode of the ODTS 1 based on a self-refresh signal SREF, and controls an operation on a test mode of the ODTS 1 based on a test enable signal TEST_ENABLE. In detail, the operating controller 5 controls an operation of the temperature voltage generating unit 2 by generating a first operating control signal BGR_ON, controls an operation of the analog-to-digital converting unit 3 by generating a second operating control signal ADC_ON, and controls an operation of the ODTS 1 by generating a test mode signal TEST_MODE for controlling the test mode operation.

A multi-purpose register 6 located at outside of the ODTS 1 stores the temperature information code TEMP_CODE in response to the second update signal UPDATE2. The stored temperature information code TEMP_CODE is output to the outside through a data output pad (DQ_PAD) or a memory controller can change a refresh period of the semiconductor memory device by reading the temperature information code TEMP_CODE stored by the multi-purpose register 6.

A self-refresh oscillation unit 7 located at outside of the ODTS 1 operates in the self-refresh mode and changes a self-refresh period of the semiconductor memory device in response to the plurality of flag signals TRIP_POINT_FLAG<1:M>.

As described above, the conventional ODTS 1 can operate when the enable signal ENABLE, the self-refresh signal SREF, and the test enable signal TEST_ENABLE are input from the outside. It is debated in a Joint Electron Device Engineering Council (JEDEC) about a method for using an impedance matching command ZQCAL_CMD to define an operating point of the ODTS, i.e., a time when the enable signal ENABLE, the self-refresh signal SREF, and the test enable signal TEST_ENABLE are input from the outside.

If not the impedance matching command ZQCAL_CMD, various commands used in the semiconductor memory device can be used for defining an operating point of the ODTS. Further, vendors for manufacturing and offering the semiconductor memory device can suggest various opinions according to their own conditions and interests. However, it is difficult to define a specification of the ODTS by coping with the various opinions of the vendors one by one.

SUMMARY OF THE INVENTION

Embodiments of the present invention are directed to an on die thermal sensor (ODTS) capable of coping with any specification discussed in an ODTS test group (TG) of a Joint Electron Device Engineering Council (JEDEC) for defining an operating point of the ODTS.

In accordance with an aspect of the present invention, there is provided a semiconductor memory device having an on die thermal sensor (ODTS), including: a temperature information output unit for measuring an internal temperature of the semiconductor memory device, and generating a plurality of flag signals, each voltage level of which varies according to the measured internal temperature; a self-refresh oscillation unit for providing a self-refresh period corresponding to the measured internal temperature in response to the plurality of flag signals; and a temperature information control unit for determining a measuring period of the temperature information output unit in response to a temperature sensing enable signal and the plurality of flag signals.

In accordance with another aspect of the present invention, there is provided a method for measuring an internal temperature of a semiconductor memory device, including: generating a plurality of flag signals by measuring an internal temperature of a semiconductor memory device, each voltage level of the plurality of flag signals corresponding to the measured internal temperature; providing a self-refresh period corresponding to the measured internal temperature in response to the plurality of flag signals; and determining a measuring period of the internal temperature of the semiconductor memory device in response to the plurality of flag signals and a temperature sensing enable signal.

BRIEF DESCRIPTION OF THE DRAWINGS

FIG. 4 is a timing diagram illustrating a relationship between a plurality of flag signals output from a temperature information output unit shown in FIG. 2 and an internal temperature of a semiconductor memory device.

DESCRIPTION OF SPECIFIC EMBODIMENTS

It is an object of the present invention to provide an on die thermal sensor (ODTS) for coping with any specification discussed in an ODTS test group (TG) of a Joint Electron Device Engineering Council (JEDEC) for defining an operating point of the ODTS.

Hereinafter, the ODTS in accordance with the present invention will be described in detail referring to the accompanying drawings.

Figure 1:
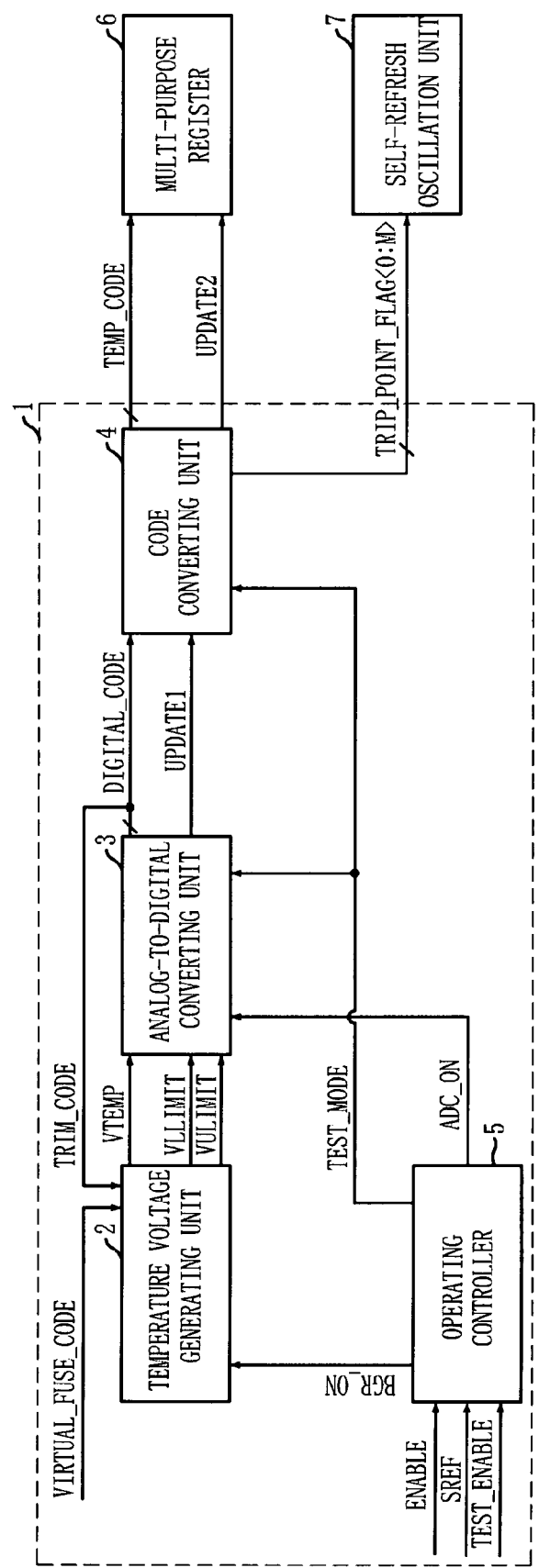
FIG. 1 is a block diagram of a conventional on die thermal sensor (ODTS) for use in a semiconductor memory device.
Figure 2:
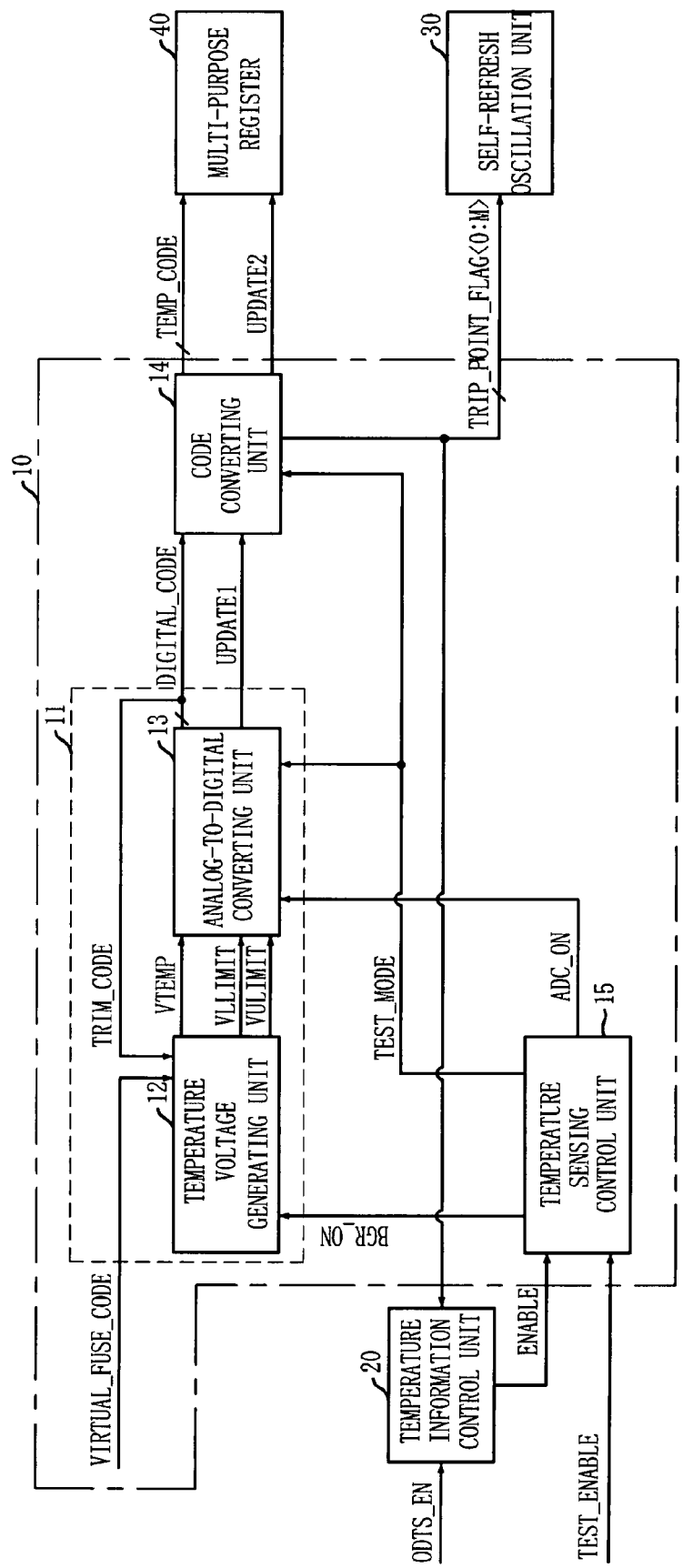
FIG. 2 is a block diagram of a semiconductor memory device in accordance with an embodiment of the present invention.

FIG. 2 is a block diagram a semiconductor memory device in accordance with an embodiment of the present invention.

The semiconductor memory device of the present invention includes a temperature information output unit 10, a temperature information control unit 20 and a self-refresh oscillation unit 30.

The temperature information output unit 10 measures an internal temperature of the semiconductor memory device, and generates a temperature information code TEMP_CODE and a plurality of flag signals TRIP_POINT_FLAG<0:M>, M being a positive integer. Herein, each voltage level of the plurality of flag signals TRIP_POINT_FLAG<0:M> varies according to the measured internal temperature. The temperature information control unit 20 determines a measuring period of the temperature information output unit 10 in response to a temperature sensing enable signal ODTS_EN and the plurality of flag signals TRIP_POINT_FLAG<0:M>. The self-refresh oscillation unit 30 changes a self-refresh period to be corresponded to the internal temperature of the semiconductor memory device in response to the plurality of flag signals TRIP_POINT_FLAG<0:M>.

In detail, the temperature information output unit 10 includes a temperature sensing unit 11, a code converting unit 14, and a temperature sensing control unit 15.

The temperature sensing unit 11 measures the internal temperature of the semiconductor memory device, to generate a digital code DIGITAL_CODE having a digital value, and outputs a first update signal UPDATE1 informing an update of the digital code. DIGITAL_CODE when the digital code DIGITAL_CODE is updated according to the internal temperature of the semiconductor memory device. The code converting unit 14 performs a preset operation to convert the digital code DIGITAL_CODE into the temperature information code TEMP_CODE and the plurality of flag signals TRIP_POINT_FLAG<0:M> and output the temperature information code TEMP_CODE with a second update signal UPDATE2 informing an update of the temperature information code TEMP_CODE in response to the first update signal UPDATE1. The temperature sensing control unit 15 controls an operation of the temperature sensing unit 11 based on an enable signal ENABLE, and controls an operation of the code converting unit 14 based on a test enable signal TEST_ENABLE.

Further, the temperature sensing unit 11 includes a temperature voltage generating unit 12 and an analog-to-digital converting unit 13.

The temperature voltage generating unit 12 detects the internal temperature of the semiconductor memory device and generates a temperature voltage VTEMP according to the detected internal temperature. Furthermore, the temperature voltage generating unit 12 outputs maximum and minimum variation voltages VULIMIT and VLLIMIT. The maximum and minimum variation voltages VULIMIT and VLLIMIT are generated from a bandgap circuit provided in the temperature voltage generating unit 12 and keep a constant voltage level despite of a variation of process, voltage and temperature (PVT). A user can set voltage levels of the maximum and minimum variation voltages VULIMIT and VLLIMIT in response to a virtual fuse code VIRTUAL_FUSE_CODE and an adjusting code TRIM_CODE. For the reference, the temperature voltage VTEMP decreases as the internal temperature increases. Each of the first and second variation voltages VULIMIT and VLLIMIT has a constant voltage level regardless of a temperature variation.

The analog-to-digital converting unit 13 converts the temperature voltage VTEMP having an analog value and outputs the digital code DIGITAL_CODE and the first update signal UPDATE1 in response to the first and second variation voltages VULIMIT and VLLIMIT. Herein, a voltage level of the digital code DIGITAL_CODE is adjusted between the maximum variation voltage VULIMIT and the minimum variation voltage VLLIMIT, and input to the temperature voltage generating unit 12 as the adjusting code TRIM_CODE to thereby adjust the digital code DIGITAL_CODE between the maximum variation voltage VULIMIT and the minimum variation voltage VLLIMIT.

The multi-purpose register 40 stores the temperature information code TEMP_CODE in response to the second update signal UPDATE2. The stored temperature information code TEMP_CODE is output to the outside through a data output pad (DQ_PAD) or a memory controller can change a refresh period of the semiconductor memory device by reading the temperature information code TEMP_CODE stored by the multi-purpose register 40.

In detail, the temperature sensing control unit 15 controls an operation of the temperature voltage generating unit 12 by generating a first operating control signal BGR_ON, controls an operation of the analog-to-digital converting unit 13 by generating a second operating control signal ADC_ON, and controls operations of the analog-to-digital converting unit 13 and the code converting unit 14 by generating a test mode signal TEST_MODE for controlling the test mode operation.

In accordance with the present invention, the temperature sensing control unit 15 controls an operation of measuring the internal temperature of the semiconductor memory device in response to an output of the temperature information control unit 20. On the other hand, the conventional ODTS controls an operation of measuring the internal temperature of the semiconductor memory device according to an operating mode, i.e., a normal mode, a self-refresh mode, and a test mode.

Figure 3:
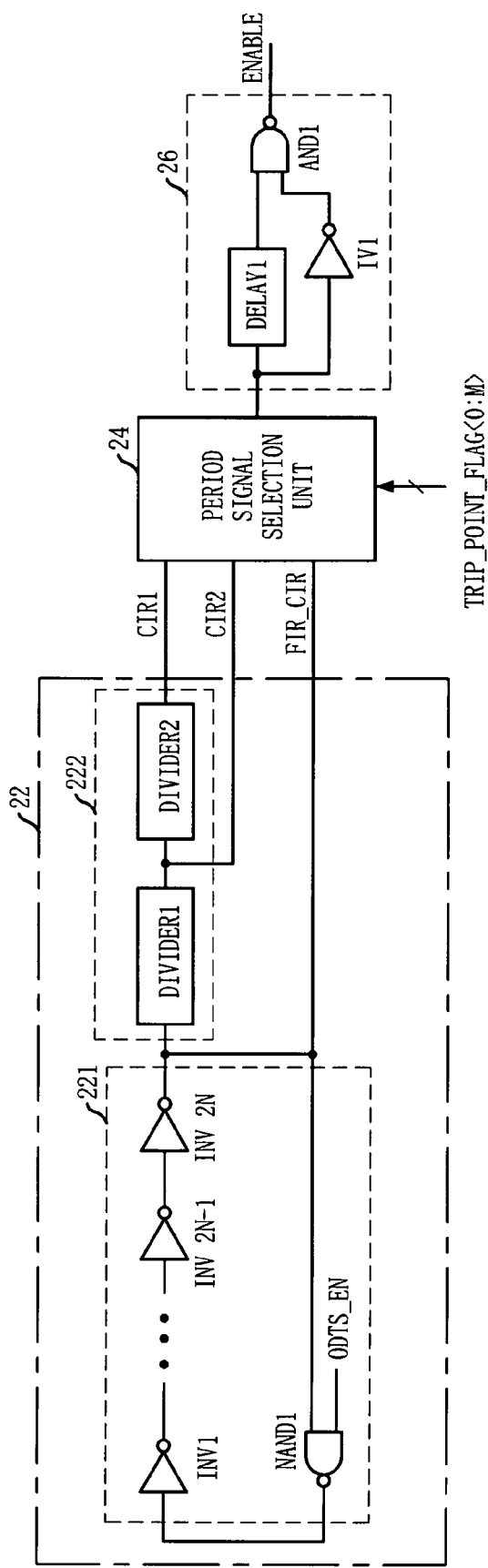
FIG. 3 is a detailed block diagram of a temperature information control unit shown in FIG. 2.

FIG. 3 is a detailed block diagram of the temperature information control unit 20 shown in FIG. 2.

The temperature information control unit 20 includes a period signal generating unit 22, a period signal selection unit 24, and an active section duration unit 26.

The period signal generating unit 22 generates an initial period signal FIR_CIR, and first and second period signals CIR1 and CIR2, each period signal having a different period, in response to the temperature sensing enable signal ODTS_EN. The period signal selection unit 24 selects one of an initial period signal FIR_CIR and the first and second period signals CIR1 and CIR2 in response to the plurality of flag signals TRIP_POINT_FLAG<0:M>. The active section duration unit 26 maintains an active state for a constant section even if any period signal is selected by the period signal selection unit 24. Herein, the temperature sensing enable signal ODTS_EN is output from a memory register set (MRS) and enabled when the internal temperature of the semiconductor memory device is measured.

In detail, the period signal generating unit 22 includes an oscillation unit 221 and a dividing unit 222. The oscillation unit 221 oscillates and outputs the initial period signal FIR_CIR having a preset period in response to the temperature sensing enable signal ODTS_EN. The dividing unit 222 includes first and second unit dividers DIVIDER1 and DIVIDER2, each divider for generating a corresponding one of the first and second period signals CIR1 and CIR2 by dividing the period of the initial period signal FIR_CIR by a different rate.

The oscillation unit 221 includes a NAND gate NAND1 for performing a NAND operation to the temperature sensing enable signal ODTS_EN and the initial period signal FIR_CIR, and a plurality of inverters INV1, . . . , INV2N−1, and INV2N for outputting the initial period signal FIR_CIR by delaying an output of the NAND gate NAND1 by a predetermined time with maintaining its phase.

The active section duration unit 26 includes a delay DELAY1, an inverter IV1 and an AND gate AND1. The delay DELAY1 delays an output of the period signal selection unit 24 by a predetermined time. The inverter IV1 inverts the output of the period signal selection unit 24. The AND gate AND1 performs an AND operation to outputs of the delay DELAY1 and the inverter IV1.

Hereinafter, referring to FIGS. 2 and 3, an operation of the semiconductor memory device in accordance with the present invention is explained.

At a first step, if the temperature sensing enable signal ODTS_EN output from the MRS is enabled, the temperature information control unit 20 determines a toggling period of the enable signal ENABLE in response to initial values of the plurality of flag signals TRIP_POINT_FLAG<0:M>.

At a second step, the temperature information output unit 10 measures the internal temperature of the semiconductor memory device to output the plurality of flag signals TRIP_POINT_FLAG<0:M>, each voltage level corresponding to the measured internal temperature, in response to the enable signal ENABLE output from the temperature information control unit 20.

At a third step, the self-refresh oscillation unit 30 changes the self-refresh period corresponding to the internal temperature of the semiconductor memory device in response to the plurality of flag signals TRIP_POINT_FLAG<0:M>.

As described above, the temperature information control unit 20 of the present invention can determine the measuring period of the temperature information output unit 10 by determining the toggling period of the enable signal ENABLE in response to the plurality of flag signals TRIP_POINT_FLAG<0:M>.

Herein, the above first step is used when there is no information relating to the internal temperature of the semiconductor memory device. Further, the second and third steps are repeated while the temperature sensing enable signal ODTS_EN output from the MRS is activated.

In detail, the first step, i.e., a method for determining the toggling period of the enable signal ENABLE in response to the plurality of flag signals TRIP_POINT_FLAG<0:M>, includes fourth to sixth steps which are as follows.

At the fourth step, the period signal generating unit 22 generates the first and second period signals CIR1 and CIR2, and the initial period signal FIR_CIR, each period signal having the different period, in response to the temperature sensing enable signal ODTS_EN.

At the fifth step, the period signal selection unit 24 selects one of the initial period signal FIR_CIR and the first and second period signals CIR1 and CIR2 in response to the plurality of flag signals TRIP_POINT_FLAG<0:M>.

At the sixth step, the active section duration unit 26 maintains the active state for a constant section even if any period signal is selected by the period signal selection unit 24.

In particular, the fourth step, i.e., a method for generating the first and second period signals CIR1 and CIR2, and the initial period signal FIR_CIR, includes seventh and eighth steps.

At the seventh step, the oscillation unit 221 oscillates and outputs the initial period signal FIR_CIR having a preset period in response to the temperature sensing enable signal ODTS_EN.

At the eighth step, the dividing unit 222 outputs the first and second period signals CIR1 and CIR2 by dividing the period of the initial period signal FIR_CIR by a different rate.

Further, the fifth step, i.e., a method for selecting one of the initial period signal FIR_CIR and the first and second period signals CIR1 and CIR2, includes a ninth step.

At the ninth step, the period signal selection unit 24 selects one of the initial period signal FIR_CIR and the first and second period signals CIR1 and CIR2 according to the number of activated ones of the plurality of flag signals TRIP_POINT_FLAG<0:M>.

FIG. 4 is a timing diagram illustrating a relationship between the plurality of flag signals TRIP_POINT_FLAG<0:M> output from the temperature information output unit 10 shown in FIG. 2 and the internal temperature of the semiconductor memory device.

As shown, the logic levels of the plurality of flag signals TEMP A, TEMP B and TEMP C are changed according to the internal temperature of the semiconductor memory device. As the internal temperature increases, relatively more flag signals are changed to a logic high level.

As described above, in accordance with the preferred embodiment of the present invention, an ODTS used in a semiconductor memory device can measure an internal temperature of the semiconductor memory device by defining its operating point according to the internal temperature.

Namely, at an initial step for sensing the internal temperature of the semiconductor memory device, the ODTS operates with a preset period. After the temperature information is generated, the ODTS operates with a period determined by feedbacking the temperature information. Accordingly, there is no need to separately generate a signal for operating the ODTS of the semiconductor memory device.

In accordance with the preferred embodiment of the present invention, the ODTS can independently operate regardless of internal commands or an operating state of the semiconductor memory device. Further, various specifications of the ODTS can flexibly meet suggestions of plural vendors to manufacture and offer the semiconductor memory device.

While the present invention has been explained respect to the specific embodiments, it will be apparent to those skilled in the art that various changes and modifications may be made without departing from the spirit and scope of the invention as defined in the following claims.

What is claimed is:

1. A semiconductor memory device, comprising:
   a temperature information output unit configured to measure an internal temperature of the semiconductor memory device, and to generate a plurality of flag signals each having a voltage level varying based on the measured internal temperature;
   a self-refresh oscillation unit configured to provide a self-refresh period corresponding to the measured internal temperature in response to the plurality of flag signals outputted from the temperature information output unit; and
   a temperature information control unit configured to determine a measuring period of the temperature information output unit in response to a temperature sensing enable signal and the plurality of flag signals,
   wherein the temperature information control unit includes:
   a period signal generating unit configured to generate an initial period signal, and a plurality of additional period signals each having a different period in response to the temperature sensing enable signal; and
   a period signal selection unit configured to select, for determining the measuring period, one of the initial periodsignal and the plurality of additional period signals in response to the plurality of flag signals.

2. The semiconductor memory device as recited in claim 1, wherein the period signal generating unit includes:
   an oscillation unit for oscillating and outputting the initial period signal having a preset period in response to the temperature sensing enable signal; and
   a dividing unit for outputting the plurality of additional period signals by dividing a period of the initial period signal by a different rate.

3. The semiconductor memory device as recited in claim 2, wherein the oscillation unit includes:
   a NAND gate for performing a NAND operation between the temperature sensing enable signal and the initial period signal; and
   a plurality of inverters for outputting the initial period signal by delaying an output of the NAND gate by a predetermined time with maintaining its phase.

4. The semiconductor memory device as recited in claim 2, wherein the Dividing unit includes a plurality of unit dividers, each for outputting a corresponding one of the plurality of flag signals.

5. The semiconductor memory device as recited in claim 1, wherein the temperature information control unit further includes an active section duration unit for maintaining an active state for a constant section even if any period signal is selected by the period signal selection unit.

6. The semiconductor memory device as recited in claim 5, wherein the active section duration unit includes:
   a delay for delaying an output of the period signal selection unit by a predetermined time;
   an inverter for inverting the output of the period signal selection unit; and
   an AND gate for performing an AND operation between outputs of the delay and the inverter.

7. The semiconductor memory device as recited in claim 1, wherein the temperature information output unit includes:
   a temperature sensing unit for measuring the internal temperature of the semiconductor memory device to generate a digital code;
   a code converting unit for performing a preset operation to convert the digital code into the plurality of flag signals; and
   a temperature sensing control unit for controlling an operation of the temperature sensing unit based on an output of the temperature information control unit.

8. The semiconductor memory device as recited in claim 7, wherein the temperature sensing unit includes:
   a temperature voltage generating unit for detecting the internal temperature of the semiconductor memory device and generating a temperature voltage according to the detected internal temperature, wherein a voltage level of the temperature voltage decreases as the internal temperature increases; and
   an analog-to-digital converting unit for converting the temperature voltage having an analog value and outputting the digital code.

9. The semiconductor memory device as recited in claim 1, further comprising a multi-purpose register for storing the temperature information code.

10. The semiconductor memory device as recited in claim 1, wherein the temperature sensing enable signal is output from a memory register set (MRS) and enabled when the internal temperature of the semiconductor memory device is measured.

11. A method for measuring an internal temperature of a semiconductor memory device, the method comprising:
generating a plurality of flag signals by measuring an internal temperature of a semiconductor memory device, the voltage level of each of the plurality of flag signals corresponding to the measured internal temperature;
providing a self-refresh period corresponding to the measured internal temperature in response to the plurality of flag signals; and
determining a measuring period of the internal temperature of the semiconductor memory device in response to the plurality of flag signals and a temperature sensing enable signal,
wherein the determining of the measuring period of the internal temperature includes:
generating an initial period signal and a plurality of additional period signals, each of the additional period signals having a different period, in response to the temperature sensing enable signal; and
selecting, for determining the measuring period, one of the initial period signal and the plurality of additional period signals in response to the plurality of flag signals.

12. The method as recited in claim 11, wherein the step of determining the period for measuring the internal temperature further includes maintaining an active state for a constant section even if any period signal is selected.

13. The method as recited in claim 11, wherein the step of generating the initial period signal and the plurality of additional period signals:
oscillating and outputting the initial period signal having a preset period in response to the temperature sensing enable signal; and
generating the plurality of period signals by dividing a period of the initial period signal by a different rate.

14. The method as recited in claim 11, wherein the step of selecting one of the initial period signal and the plurality of additional period signals is performed according to the number of activated ones of the plurality of flag signals.

15. A semiconductor memory device, comprising:
a temperature information output unit configured to detect an internal temperature of the semiconductor memory device and to generate a plurality of flag signals;
a self-refresh oscillation unit configured to provide a self-refresh period in response to the plurality of flag signals outputted from the temperature information output unit;
a period signal generating unit configured to output an initial period signal and a plurality of additional period signals each having a different period in response to a temperature sensing enable signal inputted from an external; and
a period signal selection unit configured to select, for determining a measuring period of the temperature information output unit, one of the initial period signal and the plurality of additional period signals in response to the plurality of flag signals.

16. The semiconductor memory device of claim 15, wherein each of the plurality of flag signals has a voltage level varying based on detected internal temperature, and the self refresh period is corresponding to the detected internal temperature.

* * * * *